(12) United States Patent
Joshi et al.

(10) Patent No.: US 8,473,879 B2
(45) Date of Patent: *Jun. 25, 2013

(54) ON-CHIP LEAKAGE CURRENT MODELING AND MEASUREMENT CIRCUIT

(75) Inventors: Rajiv V. Joshi, Yorktown Heights, NY (US); Rousaida N. Kanj, Round Rock, TX (US); Jente B. Kuang, Austin, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/484,868

(22) Filed: May 31, 2012

(65) Prior Publication Data

US 2012/0293197 A1 Nov. 22, 2012

Related U.S. Application Data

(63) Continuation of application No. 12/419,377, filed on Apr. 7, 2009, now Pat. No. 8,214,777.

(51) Int. Cl.
*G06F 17/50* (2006.01)
(52) U.S. Cl.
USPC .......................................... 716/100; 716/110
(58) Field of Classification Search
USPC ....................................................... 716/100
See application file for complete search history.

(56) References Cited

U.S. PATENT DOCUMENTS

| 6,838,869 | B1 | 1/2005 | Rogers et al. |
| 7,250,783 | B2 | 7/2007 | Hsu et al. |
| 7,423,446 | B2 | 9/2008 | Agarwal et al. |
| 2005/0050494 | A1* | 3/2005 | McGuffin et al. ................. 716/5 |
| 2007/0252613 | A1 | 11/2007 | Hsu et al. |
| 2008/0191791 | A1* | 8/2008 | Nomura et al. ............... 327/540 |
| 2008/0209285 | A1 | 8/2008 | Acharyya et al. |
| 2010/0257492 | A1 | 10/2010 | Joshi et al. |

OTHER PUBLICATIONS

USPTO U.S. Appl. No. 12/419,377, 3 pages.
Aldrete-Vidrio, et al., "Differential Temperature Sensors Fully Compatible With a 0.35-um CMOS Process", IEEE Transactions on Components and Packaging Technologies, vol. 30, No. 4, Dec. 2007, 9 pages.

(Continued)

*Primary Examiner* — Vuthe Siek
*Assistant Examiner* — Eric Lee
(74) *Attorney, Agent, or Firm* — Stephen R. Tkacs; Stephen J. Walder, Jr.; Eustus D. Nelson

(57) ABSTRACT

At least one N-type transistor and at least one P-type transistor separate from the digital circuit are sized to represent the total area of the corresponding type transistors in the digital circuit. The gates of the N-type transistor and P-type transistors are set to voltages according to the corresponding off-state logic levels of the digital circuit. The N-type and P-type transistors form a portion of corresponding current mirror circuits, which can provide outputs to a leakage current monitor and/or a control circuit such as a comparator that determines when leakage current for the N-type or P-type devices has exceeded a threshold. The output of the measurement/control circuit can be used to determine a temperature of and/or control operation of the digital circuit or the system environment of the integrated circuit.

18 Claims, 6 Drawing Sheets

OTHER PUBLICATIONS

Fujii, M. et al., "On-chip leakage monitor circuit to scan optimal reverse bias voltage for adaptive body-bias circuit under gate induce drain leakage effect", IEEE, Nov. 18, 2008, 4 pages.

Keshavarzi, A. et al., "Effectiveness of Reverse Body Bias for Leakage Control in Scaled Dual VT CMOS ICs", ACM, Aug. 6, 2001, 6 pages.

Kuroda, Tadahiro et al., "Chapter 3 Adaptive Circuit Technique for Managing Power Consumption", Springer Science+Business Media, 2008, 25 pages.

Serra-Graells, et al., "Sub-1-V CMOS Proportional-to-Absolute Temperature References", IEEE, 2003, 5 pages.

Shih, et al., "High Sensitive and Wide Detecting Range MOS Tunneling Temperature Sensors for On-Chip Temperature Detection", IEEE Transactions on Electron Devices, vol. 51, No. 9, Sep. 2004, 8 pages.

Tsai, et al., "High Linear Voltage References for on-chip CMOS Temperature Sensor", IEEE, 2006, 4 pages.

Yasuda, Takeo, "On-Chip Temperature Sensor with High Tolerance for Process and Temperature Variation", IEEE, 2005, 4 pages.

* cited by examiner

ON-CHIP LEAKAGE CURRENT MODELING AND MEASUREMENT CIRCUIT

BACKGROUND OF THE INVENTION

1. Field of the Invention

The present invention is related to design characterization methods and circuits, and more particularly to integrated circuits having on-chip leakage current monitors, such as leakage current estimation or measurement circuits.

2. Description of Related Art

In very large-scale integrated circuits (VLSI) such as semiconductor memories and microprocessors, accurate leakage current measurement is typically not possible, since measurement of true leakage current requires that all of the devices under measurement be in an "off" state, which generally cannot be commanded at the same time across an entire integrated circuit die. Further, even if all leakage current paths have an "off" device (e.g., a CMOS circuit in a static state), both "off" devices and "on" devices vary in type and strength across the die. Leakage current across a die is difficult to model, and any model will deviate substantially from actual leakage current, as the combination of local variation with variation of the design values combines significantly, particularly in present-day low voltage technologies, in which the power supply voltages are decreasing to below one volt.

If a truly accurate leakage current monitor circuit were available, leakage current could be characterized across a circuit design on a die, individual device types could be characterized for leakage across voltage and temperature variations, and used to inform design decisions and monitor processes. A more accurate temperature monitoring function could also be provided, since device leakage can be used as an indicator of device temperature. Device leakage forms the basis for many temperature monitoring circuit designs, in which one or more reference devices conducts a temperature-dependent "off" state current, which is measured to generate a temperature analog. Further, leakage current values could be used as a control mechanism for maintaining energy use below a predetermined threshold, or for other purposes such as thermal control.

Present leakage current monitoring circuits typically measure a leakage of one or more devices to estimate total leakage of a device, but are not typically statistically representative of an integrated circuit design as a whole, with the exception of actual total device leakage current measurements, which can only provide measurement of the current consumed by an integrated circuit while the internal circuits are in a suspended state. Even in a suspended state, all devices are typically not in their "off" state, as noted above, and there is no ability to distinguish between leakage of different device types. Other test and measurement circuits may be provided to make leakage current measurements and/or model device current leakage, but also fail to provide a measure of true off-state leakage and fail to provide a model sufficiently accurate to the describe the actual integrated circuit.

Therefore, it would be desirable to provide methods, circuits and systems for leakage current monitoring that provide a measure of the true off-state leakage current for an integrated circuit design and provide an accurate, statistically descriptive measure of leakage current within the actual circuit being monitored. It would further be desirable to provide an accurate temperature monitor in an integrated circuit. It would be also be desirable to provide such a circuit that can provide an accurate leakage current value while the circuit being monitored is in an active operating state, and optionally control an environment and/or internal operation of the integrated circuit using leakage current monitoring results.

BRIEF SUMMARY OF THE INVENTION

Accurate monitoring of integrated circuit leakage current and/or temperature, is provided in a leakage current monitor circuit, a method of leakage current monitoring, and a system including a leakage current monitor. The monitor circuit provides a statistically representative analog of the true off-state leakage of one or more circuits, by using monitor transistors that have characteristics that represent devices within the circuit(s) for which leakage current is being monitored.

The leakage current monitor circuit is integrated on a die and includes at least one P-type monitor transistor, sized to represent a totality of the P-type transistors in a digital circuit being monitored, which is also integrated on the die. At least one N-type monitor transistor is also included in the leakage current monitor circuit, which is sized to represent a totality of the N-type transistors in the digital circuit being monitored, and both the P-type and N-type monitor transistors have gate connections set to a voltage that is substantially equal to their corresponding off-state logic level. In an alternative embodiment of the invention, only the leakage current/temperature monitor circuit is integrated on a die and is used to model the leakage current of an integrated circuit design in a test configuration, and multiple leakage current monitor circuits can be integrated on a single die to evaluate leakage current of a large number of alternative circuit designs. For example, a monitor may be assigned for each of several functional blocks, such as a memory array leakage current monitor and a logic block leakage current monitor, or multiple leakage current monitors may be provided to monitor leakage current for regions of a die, providing a geometrical map of leakage current.

A current mirroring circuit can be included within the leakage current monitor circuit and integrated on the die, to provide a monitor output, and may be amplified. The monitor output may be provided at a test pad or output pin, and/or internal comparison circuits can be provided for controlling operation of the digital circuit being monitored or a system, in which the digital circuit is integrated, and/or to provide a temperature monitoring function. The output of the comparison circuit may also be accessible to the system or to another test system via a test port, internal register or other suitable interface to inform design decisions.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention relates to a leakage current monitor circuit integrated on a die, methodologies for determining true off-state current leakage of a separate functional digital circuit integrated on the die, and systems using are such a leakage current monitor circuit to monitor and/or control the operating conditions of the digital circuit, as well as to evaluate a design of the integrated circuit. The present invention also encompasses methodologies for designing such a monitor circuit. The leakage current monitor circuit has both N-type and P-type transistors sized to represent the aggregated area of all of the N-type and P-type transistors in the digital circuit, and may include multiple N-type and P-type transistors sized according to an aggregated area of classes of the N-type and P-type transistors having differing threshold voltages.

Figure 1:
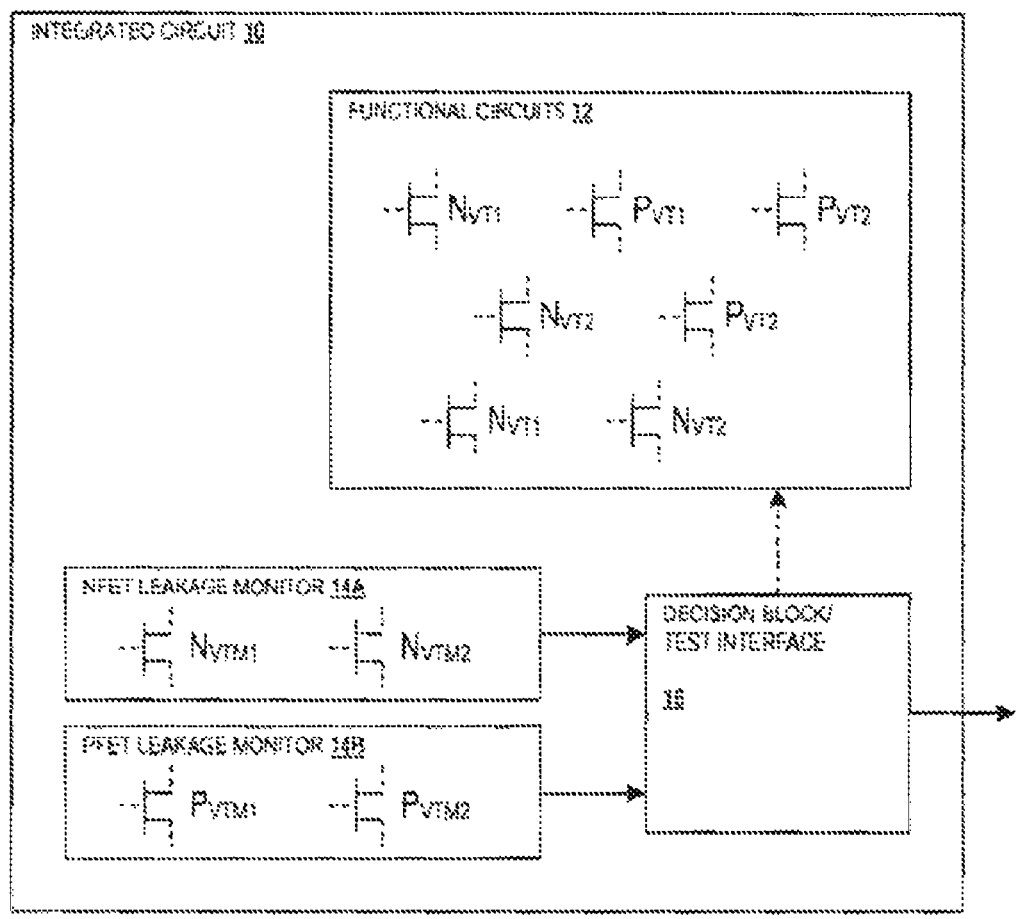
FIG. 1 is a block diagram of an integrated circuit 10 according to an embodiment of the present invention.

Referring now to FIG. 1, an integrated circuit 10 in accordance with an embodiment of the present invention is shown. Functional circuits 12 include one or more functional digital circuit block that provide the operational functions associated with integrated circuit 10. A separate NFET leakage monitor circuit 14A and PFET leakage monitor circuit 14B are provided on the same die as functional circuits 12, or optionally may be located in the kerf area outside of the singulated die region in implementations for which leakage current monitoring is only provided for manufacturing evaluation. A decision block and/or test interface circuit 16 is provided to evaluate the outputs of NFET leakage monitor circuit 14A and PFET leakage monitor circuit 14B in order to use the leakage current values for either real-time monitoring and control of functional circuits 12 and/or an environment provided to integrated circuit 10 (e.g., power supply voltage and/or operating frequency), or for manufacturing evaluation purposes in which the leakage current results can be reported through a test interface, such as a scan logic interface to provide useful evaluation results for adjusting the design of functional circuits 12 or evaluating a process used to manufacture integrated circuit 10. An integrated circuit including a leakage monitor circuit according to the present invention may, therefore, be used as a design/process evaluation tool, a real-time operating condition monitor, or may provide a combination of both functions.

Within functional circuits 12, pluralities of N-type transistors $N_{VT1}$ having a first threshold voltage value, N-type transistors $N_{VT2}$ having a second threshold voltage value, P-type transistors $P_{VT1}$ having a third threshold voltage value and P-type transistors $P_{VT2}$ having a second threshold voltage value are illustrated. Transistors $N_{VT1}$, $N_{VT2}$, $P_{VT1}$, and $P_{VT2}$ implement the digital circuits within functional circuits 12 and it is the leakage of those transistors that NEET leakage monitor circuit 14A and PFET leakage monitor circuit 14B are designed to monitor without affecting the performance of functional circuits 12 and while providing a true off-state leakage current value that cannot be obtained by directly measuring current consumed by functional circuits 12, since at least some of the transistors within functional circuits 12 will always have gates biased to a voltage corresponding to an "on" state. For example, in a CMOS digital circuit having no special provisions for separately controlling the gates of internal transistors, 50% of the transistors will be biased to an off-state and the remaining 50% will be biased to an on-state. Even though such a circuit in a static state can be considered "disabled"; since CMOS circuits are only active during switching, measurement of the power supply current passing through the circuit is not a measurement of true leakage current, since some of the transistors are on.

In order to determine true leakage current values for transistors $N_{VT1}$, $N_{VT2}$, $P_{VT1}$, and $P_{VT2}$ in functional circuits 12, NFET leakage monitor circuit 14A includes NFET monitor transistors $N_{VTM1}$ and $N_{VTM2}$, corresponding to transistors $N_{VT1}$ and $N_{VT2}$. PFET leakage monitor circuit 14B includes PFET monitor transistors $P_{VTM1}$ and $P_{VT2}$, corresponding to transistors $P_{VT1}$ and $P_{VT2}$. Monitor transistor $N_{VTM1}$ has a threshold voltage equal to that of transistors $N_{VT1}$ and has a device area sized in proportion to a nominal total device area of transistors $N_{VT1}$, which may be determined according to nominal design values, a statistical simulation of process variation across integrated circuit 10, or collected manufacturing data for integrated circuit 10. The size is generally greatly reduced in proportion, such that leakage current measured through monitor transistor $N_{VTM1}$ is negligible with respect to the actual leakage current passing through transistor $N_{VT1}$ so that leakage current introduced by NFET leakage monitor circuit 14A is negligible for real-time leakage current monitoring applications. Similarly, monitor transistors $N_{VTM2}$, $P_{VTM1}$ and $P_{VTM2}$ have device areas and threshold voltage corresponding to groups of transistors $N_{VT2}$, $P_{VT1}$ and $P_{VT2}$, respectively, so that the types of transistors included in functional circuits 12 are represented in the leakage current determinations. While the number of transistor types illustrated number four (two threshold voltage values by two transistor dopant/polarity types), it is understood that any number of groups of transistors according to type within functional circuits 12 can be represented by similar/identical transistors within NFET leakage monitor circuit 14A and PFET leakage monitor circuit 14B, so that the leakage current determinations accurately represent the actual devices in functional circuits 12. Further, more than one transistor for each type may be included within NFET leakage monitor circuit 14A and PFET leakage monitor circuit 14B, providing for easy design adjustment of a design of NFET leakage monitor circuit 14A and PFET leakage monitor circuit 14B using fingering techniques, for example Leakage current distribution averages may be obtained for each of the device types, and may also be obtained by region or by functional circuit type by implementing multiple leakage current monitors for different circuits and/or for distribution across the die.

Figure 2A:
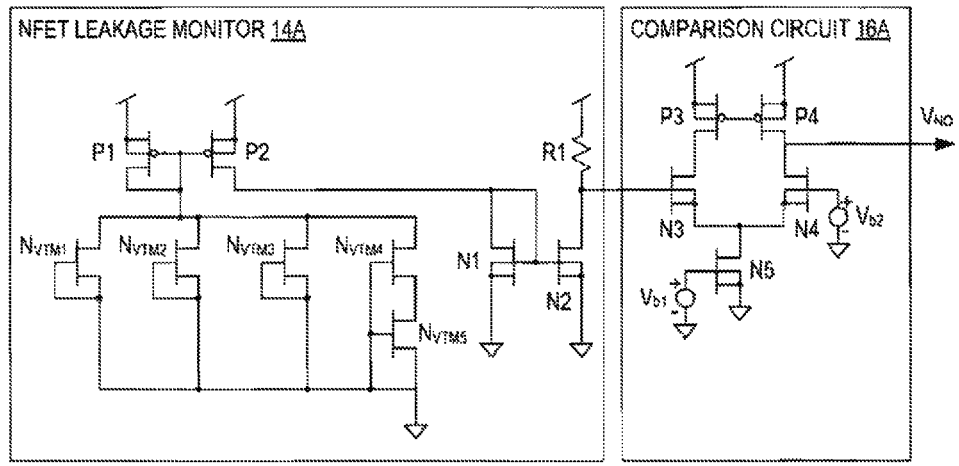
FIGS. 2A-2B are schematic diagrams of leakage current monitor circuits that may be used to implement leakage current monitor blocks 14A and 14B, respectively, within integrated circuit 10 of FIG. 1 according to an embodiment of the present invention.

Referring now to FIG. 2A, details of NFET leakage monitor circuit 14A are shown. A current source, provided by transistor P1, supplies current to monitor transistors $N_{VTM1}$-$N_{VTM5}$, which represent aggregate N-channel transistor device areas in functional circuits 12 of FIG. 1, according to different threshold voltage types of transistor, and in the case of monitor transistors $N_{VTM4}$ and $N_{VTM5}$, a "stacked" transistor configuration as may occur in functional circuits 12 when foot devices, power control circuits, tri-state buffers, and the like are present. As noted above, the current through monitor transistors $N_{VTM1}$-$N_{VTM5}$ is a statistically representative analog of the true leakage current through the N-channel devices in functional circuits 12, because the device areas of monitor transistors $N_{VTM1}$-$N_{VTM5}$ are proportionally representative of the device areas of the actual N-channel transistors within functional circuits 12, according to the threshold voltage type and/or stacking configurations of the actual N-channel transistors, and further because the gates of monitor transistors $N_{VTM1}$-$N_{VTM5}$ are biased at the power supply rail voltage corresponding to the logical off state for N-channel transistors in the functional circuits 12, i.e., ground in the illustrated embodiment. The current source provided by transistor P1 is one branch of a current mirror additionally provided by transistor P2, which sources an identical current to a differential amplifier formed by transistors N1, N2 and resistor R1. The output of the differential amplifier is supplied to a comparison circuit 16A, which includes a comparator formed by transistors N3-N5 and P3-P4. A voltage source $V_{b1}$ sets the operating point (gain) of comparison circuit 16A and a reference voltage source $V_{b2}$ provides the comparison threshold to which the output of the differential amplifier formed by transistors N1, N2 and resistor R1 is compared.

Figure 2B:
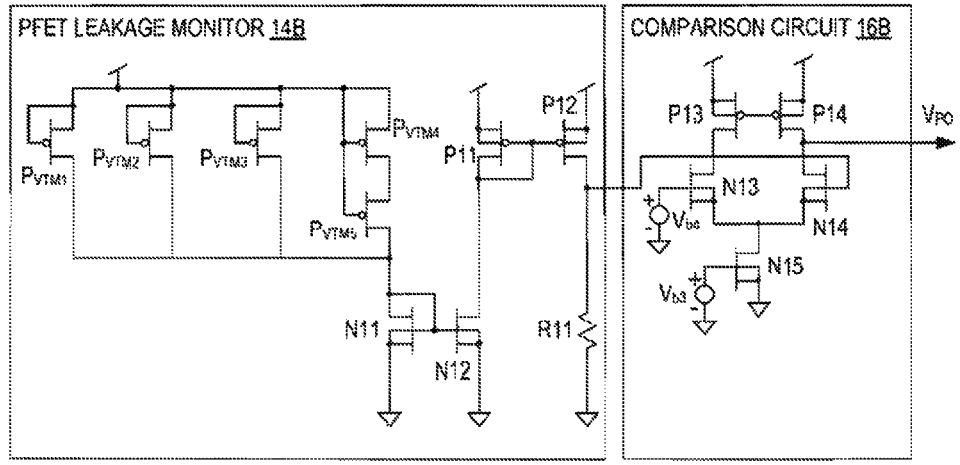

Referring now to FIG. 2B, details of PFET leakage monitor circuit 14B are shown. PFET leakage monitor circuit 14B is similar to NFET leakage monitor circuit 14A, with a change in polarity type of monitor transistors $P_{VTM1}$-$P_{VTM5}$, which represent aggregate P-channel transistor device areas in functional circuits 12 of FIG. 1, according to different threshold voltage types of transistor, and in the case of transistors $P_{VTM4}$ and $P_{VTM5}$, a "stacked" transistor configuration. As noted above, the current through monitor transistors $P_{VTM1}$-$P_{VTM5}$ is a statistically representative analog of the true leakage current through the P-channel devices in functional circuits 12, because the device areas of transistors monitor $P_{VTM1}$-$P_{VTM5}$ are proportionally representative of the device areas of the actual P-channel transistors within functional circuits 12, according to the threshold voltage type and/or stacking configurations. A current source provided by transistor N11 and shunted by leakage through transistors $P_{VTM1}$-$P_{VTM5}$ is one branch of a current mirror additionally provided by transistor N12, which sources an identical current to a differential amplifier formed by transistors P11, P12 and resistor R11. The output of the differential amplifier is supplied to a comparison circuit 16B, which includes a comparator formed by transistors N13-N15 and P13-P14. A voltage source $V_{b3}$ sets the operating point (gain) of comparison circuit 16A and a reference voltage source $V_{b4}$ provides the comparison threshold to which the output of the differential amplifier formed by transistors P11, P12 and resistor R11 is compared. By changing the relative values of voltage sources $V_{b1}$, $V_{b2}$, $V_{b3}$ and $V_{b4}$, the thresholds and relative gains with respect to N-channel and P-channel leakage can be adjusted, so that the results can be combined to provide a single leakage current monitoring or control value as will be described in detail below. Alternatively, individual controls or monitor values can be provided using just the values of N-channel and P-channel leakage as provided by NFET leakage monitor 14A and PFET leakage monitor 14B or the outputs of comparison circuits 16A and 16B.

Figure 3A:
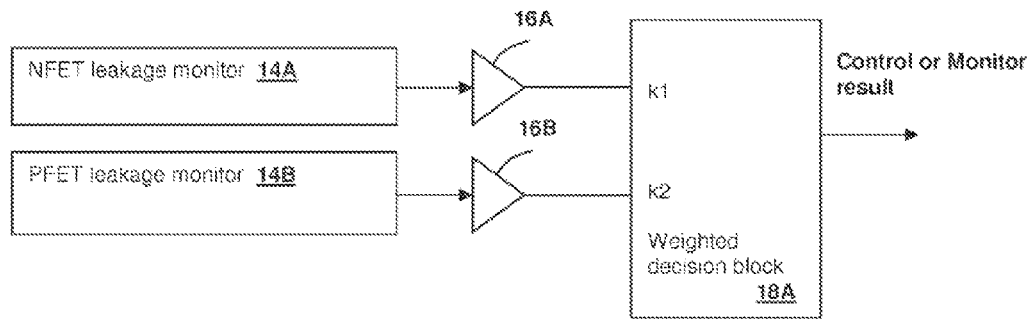
FIGS. 3A-3C are block diagrams of leakage current evaluation circuits in accordance with embodiments of the present invention are performed.
Figure 3B:
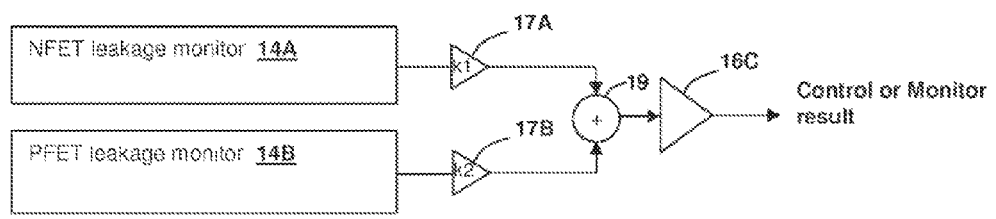
Figure 3C:
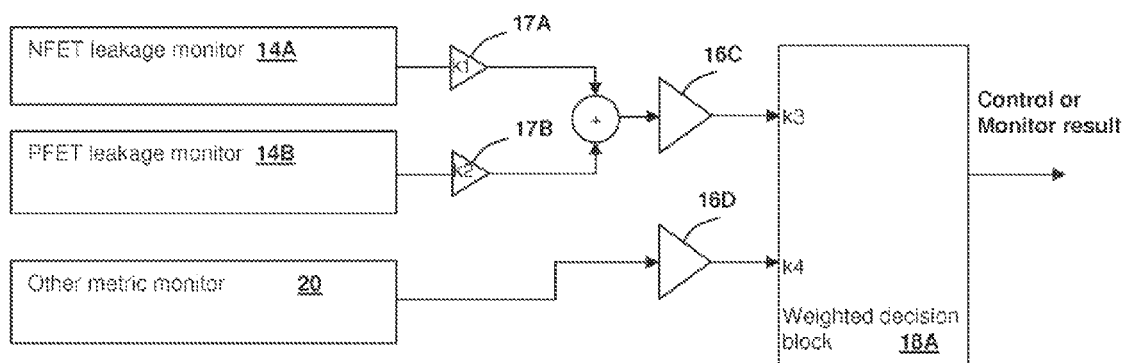

Referring now to FIGS. 3A-3C, various combining/evaluation circuits as may be used within decision block and/or test interface 16 of FIG. 1 are shown. FIG. 3A illustrates a comparison-first scheme that combines the outputs of comparison circuits 16A, 16B, which compare individually, the outputs of NFET leakage monitor circuit 14A and PFET leakage monitor circuit 14B as illustrated above; using a weighted decision block 18A. Weighted decision block 18A weights the outputs of comparison circuits 16A, 16B according to constants k1 and k2 to yield a control value or monitor value that can be used to adjust the operation or environment of functional circuits 12, for example to disable circuits/functionality or reduce power supply voltage/frequency when the output of weighted decision block 18A exceeds a threshold, or to provide a single factor output that can be used, for example to evaluate individual dies in a manufacturing process. The weighting constants, e.g., k1 and k2 can be determined in proportion to design statistics for a given design.

FIG. 3B illustrates a different scheme in which weighting factors k1 and k2 are applied by amplifiers 17A and 17B and the resulting values combined by a summing circuit 19 before comparison with a predetermined threshold using a comparator 16C. FIG. 3C illustrates a further scheme that includes all of the elements of FIG. 3B and weights a decision based on the output of comparator 16C according to a factor k3 and another metric, determined by another metric monitor 20, as compared to a threshold by a comparator 16D and weighted by a factor k4. All of the above techniques are illustrative techniques for combining the outputs of NFET leakage monitor circuit 14A and PFET leakage monitor circuit 14B to provide examples of how the true leakage values obtained by the present invention may be used, and should not be construed as limiting the possible ways of combining or using alone, the outputs of NFET leakage monitor circuit 14A and PFET leakage monitor circuit 14B as control variable and/or manufacturing/design evaluation tools.

Figure 4:
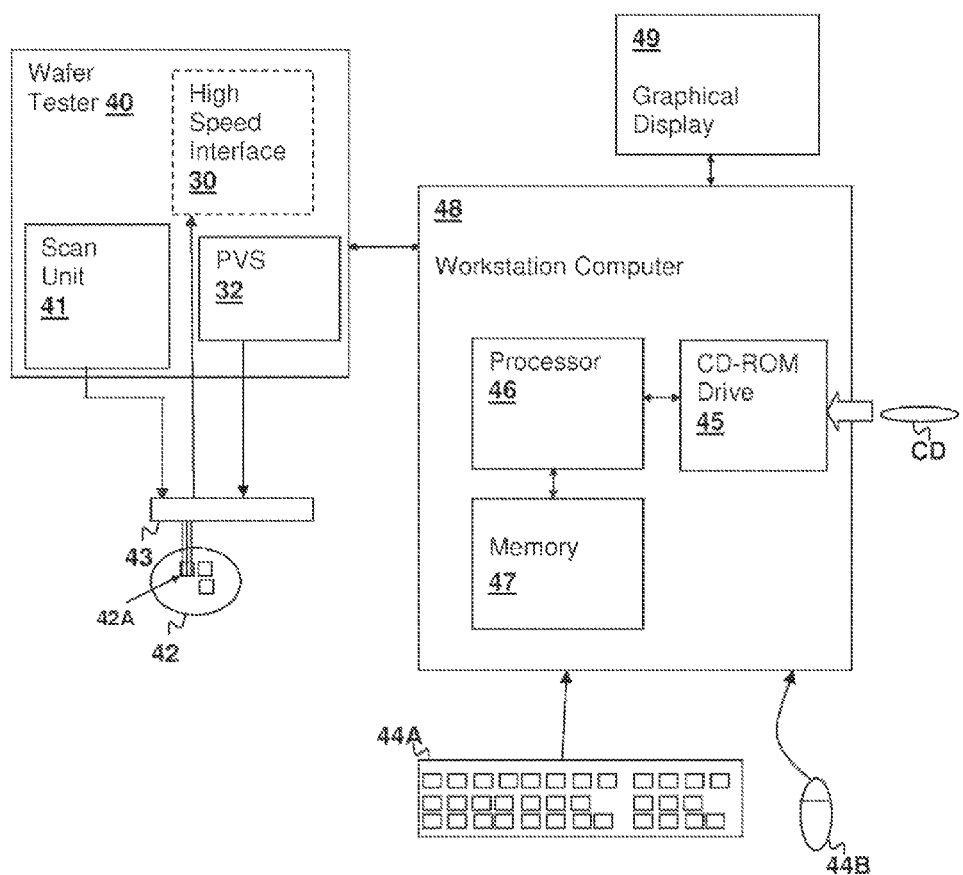
FIG. 4 is a pictorial diagram of a wafer test and design workstation computer system in which methods in accordance with embodiments of the present invention are performed.

Referring now to FIG. 4, a system in which methods according to embodiments of the invention are performed, is shown. A wafer tester 40 includes a scan unit 41 for providing stimulus to a die 42A on a wafer under test 42, via a probe head 43 having electrical test connections to die 42A. Wafer tester 40 also includes a programmable voltage supply (PVS) 32, which may be used to vary the supply voltage provided to integrated circuit 10 on die 42A in order to study leakage current vs. supply voltage. PVS 32 is coupled to die 42A via probe head 43. A high speed interface 30 is included to read information from decision block/test interface 16 of integrated circuit.

A workstation computer 48, having a processor 46 coupled to a memory 47, for executing program instructions from memory 47, wherein the program instructions include program instructions for executing one or more methods in accordance with an embodiment of the present invention, is coupled to wafer tester 40, whereby the monitoring described above is performed and leakage current monitor values are collected and stored in memory 47 and/or other media storage such as a hard disk. A CD-ROM drive 45 provides for import of program instructions in accordance with embodiments of the present invention that are stored on media such as compact disc CD. Workstation computer 48 is also coupled to a graphical display 49 for displaying program output values such as the leakage monitor values or comparison results, as well as design information concerning the transistor types and digital circuit device areas that are used to determine the device areas of the transistors in leakage current monitors 14A and 14B. Workstation computer 48 alone, without wafer tester 40 may be used to design suitable leakage current monitors from design data from an integrated circuit, and in particular, in embodiments in which the leakage current monitoring results are used for control, wafer tester 40 is not needed, nor is any other data receiving system needed to practice the invention, as the leakage current results may be used only internal to integrated circuit 10 in some embodiments of the invention. Workstation computer 48 is further coupled to input devices such as a mouse 44B and a keyboard 44A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 48. Further, workstation computer 48 may be coupled to wafer tester 40 by such a network connection.

Figure 5:
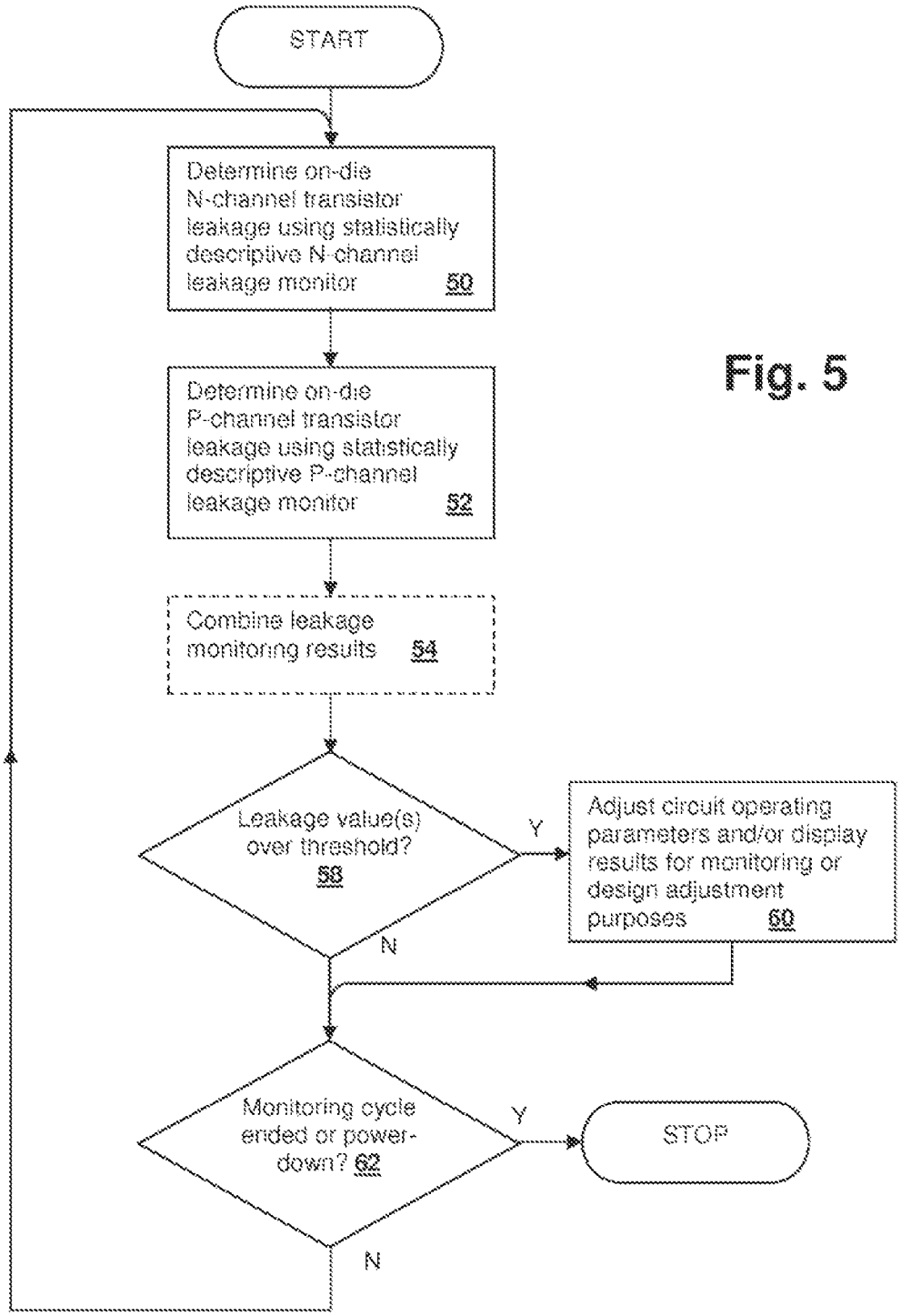
FIG. 5 is a flow chart of a leakage current monitoring method in accordance with an embodiment of the present invention.

Referring now to FIG. 5, a method of leakage current monitoring in accordance with an embodiment of the present invention is shown. Leakage through N-channel transistors in a digital circuit are determined on-die using a leakage current monitor that is statistically descriptive of the N-channel transistors in the digital circuit (step 50). Leakage through P-channel transistors in a digital circuit are determined on-die using a leakage current monitor that is statistically descriptive of the N-channel transistors in the digital circuit (step 52). The leakage current monitor values are optionally combined (step 54) and if the leakage value(s) exceed a threshold (decision 58), circuit operating parameters (e.g., power supply voltage or frequency, power management state, etc.) are adjusted, or for design evaluation purposes, the results of the leakage current monitoring are displayed (step 60). Until the monitoring cycle is ended, or in control schemes, the integrated circuit is powered-down (decision 62), steps 50-60 are repeated.

Figure 6:
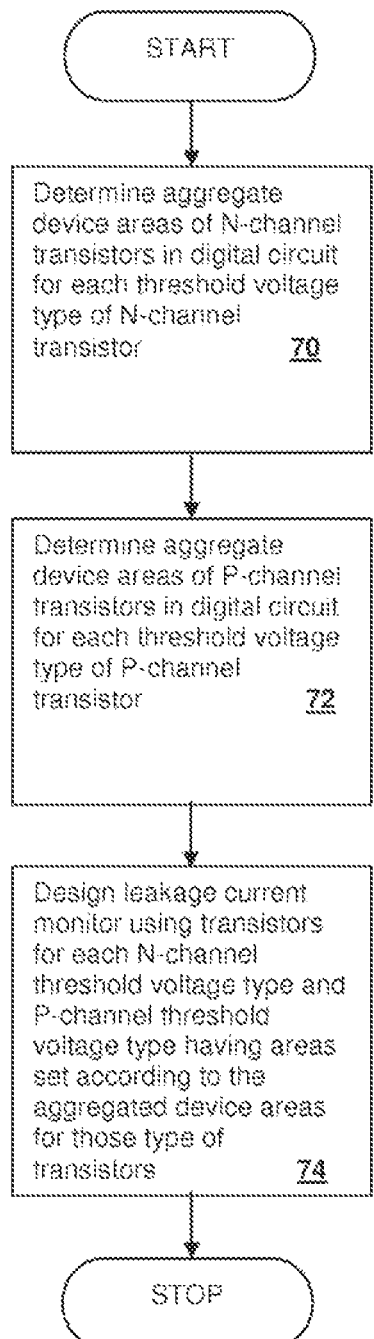
FIG. 6 is a flow chart of a leakage current monitor circuit design method in accordance with an embodiment of the present invention.

Referring now to FIG. 6, a method of designing a leakage current monitor in accordance with an embodiment of the present invention is shown. Aggregate device areas of N-channel transistors in a digital circuit are gathered for each threshold voltage type of N-channel transistor (step 70). Aggregate device areas of P-channel transistors in a digital circuit are gathered for each threshold voltage type of P-channel transistor (step 72). Then, the leakage current monitor is designed using transistors for each N-channel threshold voltage type and each P-channel threshold voltage type having areas set according to the aggregated device areas for those types of transistors.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for determining leakage current in a digital circuit integrated on a die, the method comprising:
    first providing, on the die and separate from the digital circuit, a first leakage monitor comprising at least one N-type transistor connected to a first branch of a first current mirror, the at least one N-type transistor corresponding to an off state for a first plurality of N-type transistors in the digital circuit, wherein the first leakage monitor further comprises a first differential amplifier connected to a second branch of the first current mirror such that current through the second branch of the first current mirror mirrors current through the at least one N-type transistor, the first differential amplifier generates a first leakage current value;
    second providing, on the die and separate from the digital circuit, a second leakage monitor comprising at least one P-type transistor connected to a first branch of a second current mirror, the at least one P-type transistor corresponding to an off state for a second plurality of P-type transistors in the digital circuit, wherein the second leakage monitor further comprises a second differential amplifier connected to a second branch of the second current mirror such that current through the second branch of the second current mirror mirrors current through the at least one P-type transistor, wherein the second differential amplifier generates a second leakage current value; and
    measuring the first leakage current value and the second leakage current value to determine a leakage current result based on the first leakage value and the second leakage current value.

2. The method of claim 1, further comprising combining the first leakage current value of the first leakage monitor with the second leakage current value of the second leakage monitor to form a total leakage current value through a common circuit node.

3. The method of claim 1, further comprising comparing the total leakage current value to a predetermined threshold to yield a leakage current decision value.

4. The method of claim 1, further comprising:
    first comparing the first leakage current value with a first predetermined threshold;
    second comparing the second leakage current value with a second predetermined threshold; and
    combining a result of the first comparing and the second comparing to form a leakage current decision value.

5. The method of claim 1, wherein the first providing provides a third plurality of N-type transistors as the at least one N-type transistor, and wherein the third plurality at N-type transistors have differing corresponding multiple threshold voltage values and areas, wherein the differing corresponding multiple threshold voltage values correspond to threshold voltage types in the third plurality of N-type transistors in the digital circuit, and wherein the differing corresponding areas are determined according to a total area of the third plurality of N-type transistors in the digital circuit having the corresponding threshold voltage type, and wherein the second providing provides a fourth plurality of P-type transistors as the at least one P-type transistor, and wherein the fourth plurality of P-type transistors have differing corresponding multiple threshold voltage values and areas, wherein the differing corresponding multiple threshold voltage values correspond to threshold voltage types in the fourth plurality of P-type transistors in the digital circuit, and wherein the differing corresponding areas are determined according to a total area of the fourth plurality of P-type transistors in the digital circuit having the corresponding threshold voltage type.

6. The method of claim 1, further comprising determining a nominal temperature of the digital circuit from the leakage current result.

7. The method of claim 1, further comprising adjusting an environmental operating parameter of the digital circuit in conformity with the leakage current result.

8. An integrated circuit, comprising:
    a digital circuit configured to provide a functionality of the integrated circuit;
    a first leakage monitor comprising at least one N-type transistor connected to a first branch of a first current mirror, the at least one N-type transistor corresponding to an off state for a first plurality of N-type transistors in the digital circuit, wherein the first leakage monitor further comprises a first differential amplifier connected to a second branch of the first current mirror such that current through the second branch of the first current mirror mirrors current through the at least one N-type transistor, wherein the first differential amplifier generates a first leakage current value;

second leakage monitor comprising at least one P-type transistor connected to a first branch of a second current mirror, the at least one P-type transistor corresponding to an off state for a second plurality of P-type transistors in the digital circuit, wherein the second leakage monitor further comprises a second differential amplifier connected to a second branch of the second current mirror such that current through the second branch of the second current mirror mirrors current through the at least one P-type transistor, wherein the second differential amplifier generates a second leakage current value; and a measurement circuit configured to measure the first leakage current value and the second leakage current value to determine a leakage current result based on the first leakage current value and the second leakage current value.

9. The integrated circuit of claim 8, wherein the measurement circuit comprises a summing circuit for combining the first leakage current value and the second leakage current value, wherein an output of the summing circuit provides a measurement result corresponding to the leakage current of the totality of the first plurality of N-type transistors and the second plurality of P-type transistors in the digital circuit.

10. The integrated circuit of claim 9, wherein the measurement circuit further comprises a comparison circuit for comparing the output of the summing circuit to a predetermined threshold to provide an indication that the leakage current of the totality of the first plurality of N-type transistors and the second plurality of P-type transistors in the digital circuit exceeds a pre-set value.

11. The integrated circuit of claim 8, wherein the measurement circuit comprises:
a first current sensing circuit for measuring a first leakage current at a source terminal of the at least one N-type transistor; and
a second current sensing circuit for measuring a second leakage current at a source terminal of the at least one P-type transistor, wherein the first leakage current and the second leakage current are separately measured by the measurement circuit.

12. The integrated circuit of claim 11, wherein the measurement circuit further comprises:
a first comparison circuit configured to compare an output of the first current sensing circuit to a first predetermined threshold;
at second comparison circuit configured to compare an output of the second current sensing circuit to a second predetermined threshold; and
a combining circuit configured to combining a result of the first comparison circuit and the result of the second comparison circuit to form a leakage current decision value.

13. The integrated circuit of claim 8, wherein the at least one N-type transistor comprises a third plurality of N-type transistors, and wherein the third plurality of N-type transistors have differing corresponding multiple threshold voltage values and areas, wherein the differing corresponding multiple threshold voltage values correspond to threshold voltage types in the third plurality of N-type transistors in the digital circuit, and wherein the differing corresponding areas are determined according to a total area of the third plurality of N-type transistors in the digital circuit having the corresponding threshold voltage type, and wherein the at least one P-type transistor comprises a fourth plurality of P-type transistors, and wherein the fourth plurality of P-type transistors have differing corresponding multiple threshold voltage values and areas, wherein the differing corresponding multiple threshold voltage values correspond to threshold voltage types in the fourth plurality of P-type transistors in the digital circuit, and wherein the differing corresponding areas are determined according to a total area of the fourth plurality of P-type transistors in the digital circuit having the corresponding threshold voltage type.

14. The integrated circuit of claim 8, wherein the measurement circuit is coupled to the digital circuit for controlling operation of the digital circuit in conformity with the first leakage current value and the second leakage current value.

15. The integrated circuit of claim 8, further comprising an interface coupled to an output of the measurement circuit to provide information determined in conformity with the first leakage current value and the second leakage current value to an external system.

16. A method of designing an integrated circuit having at least one integrated leakage current monitor, comprising:
determining a design of a functional digital circuit within the integrated circuit;
first aggregating first total device areas for at least one class of N-type transistor within functional circuit;
second aggregating second total device areas for at least one class of P-type transistor within the functional digital circuit;
determining a design of a leakage current monitor circuit within the integrated wherein a device area of at least one N-type transistor the generating a current measurement input is set in conformity with a result of the first aggregating, and wherein a device area of at least one P-type transistor for generating a current measurement input is set in conformity with a result of the first aggregating;
first providing, on the die and separate horn the digital circuit, a first leakage monitor comprising the at least one N-type transistor connected to a first branch of a first current mirror, the at least one N-type transistor corresponding to an off state for a first plurality of N-type transistors in the digital circuit, wherein the first leakage monitor further comprises a first differential amplifier connected to a second branch of the first current mirror such that current through the second branch of the first current mirror mirrors current through the at least one N-type transistor, wherein the first differential amplifier generates a first leakage current value; and
second providing, on the die and separate from the digital circuit, a second leakage monitor comprising the at least one P-type transistor connected to a first branch of a second current mirror, the at least one P-type transistor corresponding to an off state for a second plurality of P-type transistors in the digital circuit, wherein the second leakage monitor further comprises a second differential amplifier connected to a second branch of the second current mirror such that current through the second branch of the second current mirror mirrors current through the at least one P-type transistor, wherein the second differential amplifier generates a second leakage current value.

17. The method of claim 16, wherein the at least one class of N-type transistor includes multiple threshold voltage types of N-type transistor, wherein the at least one P-type transistor also includes multiple threshold voltage types of P-type transistor, wherein the first aggregating aggregates the first total device areas as a first set of device areas having members corresponding to a total device area of each of the N-type transistors of the functional digital circuit the each of the multiple threshold voltage types of N-type transistor, wherein the second aggregating aggregates the second total device areas as a second set of second device areas having members corresponding to a total device area of each of the P-type transistors of the functional digital circuit for each of the multiple threshold voltage types of P-type transistor, and wherein the determining determines the design of the leakage current monitor circuit such that the at least one N-type transistor comprises a plurality of N-type transistors, at least one for each of the multiple threshold voltage types of N-type transistor and having device areas determined according to the first set of device areas, and such that the at least one P-type transistor comprises a plurality of P-type transistors, at least one for each of the multiple threshold voltage types of P-type transistor and having device areas determined according to the second set of device areas.

18. The method of claim 16, further comprising:
first statistically modeling device area variation across the integrated circuit to determine a nominal total area of the at least one class of N-type transistor within the functional digital circuit;
second statistically modeling device area variation across the integrated circuit to determine is nominal total area of the at least one class of P-type transistor within the functional digital circuit;
first designing the device area of the at least one N-type transistor in the leakage current monitor circuit in conformity with a result of the first statistically modeling; and
second designing the device area of the at least one P-type transistor in the leakage current monitor circuit in conformity with a result of the second statistically modeling.

* * * * *